US012305274B1

(12) United States Patent
Tang et al.

(10) Patent No.: US 12,305,274 B1
(45) Date of Patent: May 20, 2025

(54) PVD TARGET AND USE THEREOF

(71) Applicant: ZHEJIANG SHINTOWN INDUSTRY CO., LTD, Zhejiang (CN)

(72) Inventors: Jianzhong Tang, Zhejiang (CN); Mingwei Zhang, Zhejiang (CN); Yiqi Yao, Zhejiang (CN)

(73) Assignee: ZHEJIANG SHINTOWN INDUSTRY CO., LTD, Zhejiang (CN)

( * ) Notice: Subject to any disclaimer, the term of this patent is extended or adjusted under 35 U.S.C. 154(b) by 0 days.

(21) Appl. No.: 18/923,813

(22) Filed: Oct. 23, 2024

Related U.S. Application Data

(63) Continuation of application No. PCT/CN2024/097436, filed on Jun. 5, 2024.

(30) Foreign Application Priority Data

May 5, 2024 (CN) .......................... 202410543384.5

(51) Int. Cl.
*C23C 14/34* (2006.01)
*C23C 14/02* (2006.01)
*C23C 14/35* (2006.01)
*H01J 37/34* (2006.01)

(52) U.S. Cl.
CPC ........ *C23C 14/3414* (2013.01); *C23C 14/021* (2013.01); *C23C 14/35* (2013.01); *H01J 37/3426* (2013.01)

(58) Field of Classification Search
None
See application file for complete search history.

(56) References Cited

U.S. PATENT DOCUMENTS

| 6,197,438 | B1 * | 3/2001 | Faulkner | ............ C23C 14/0611 |
| | | | | 428/908.8 |
| 2002/0022134 | A1 * | 2/2002 | Fujino | .................... H01B 1/06 |
| | | | | 428/432 |
| 2002/0125130 | A1 * | 9/2002 | Finley | .................... C23C 14/08 |
| | | | | 204/192.15 |

FOREIGN PATENT DOCUMENTS

| CN | 102251222 | A | 11/2011 |
| CN | 102978576 | A | 3/2013 |
| CN | 116657095 | A | 8/2023 |
| CN | 117230434 | A | 12/2023 |
| CN | 220800784 | U | 4/2024 |

(Continued)

OTHER PUBLICATIONS

First Office Action received in corresponding Japanese patent application No. 2024-193180, dated Jan. 7, 2025, 10 pages.

(Continued)

*Primary Examiner* — Jason Berman
(74) *Attorney, Agent, or Firm* — Cooper Legal Group, LLC

(57) ABSTRACT

The present application discloses a PVD target, the PVD target consists of the following components by mass percentage: silicon 10-30% and a balance metal, the metal includes one or more selected from a group consisting of chromium, zirconium, and titanium. The PVD target provided in the present application can form a composite film composed of metal, silicon, metal nitrides, silicon nitride, and metal silicides on a surface of a metal substrate after undergoing physical vapor deposition. The composite film can ensure a tight bonding of the composite film through a combination of substances with different particle sizes, isolate air, and avoid gaps present in PVD films formed from single-element targets.

7 Claims, 3 Drawing Sheets

(56) References Cited

FOREIGN PATENT DOCUMENTS

JP       H0243940 U    3/1990
WO    2021198445 A1   10/2021

OTHER PUBLICATIONS

International Search Report received in corresponding International Patent Application No. PCT/CN2024/097436, mailed Jan. 24, 2025, 6 pages.

* cited by examiner

PVD TARGET AND USE THEREOF

CROSS-REFERENCE TO RELATED APPLICATION

The present application is a continuation of PCT application serial No. PCT/CN2024/097436, filed on Jun. 5, 2024, which claims the priority benefits of China patent application serial No. 202410543384.5, filed on May 5, 2024. The entireties of PCT application serial No. PCT/CN2024/097436 and China patent application serial No. 202410543384.5 are hereby incorporated by reference herein and made a part of this specification.

TECHNICAL FIELD

The present application relates to a technical field of surface coating, and, in particular, to a PVD target and a use thereof.

BACKGROUND ART

Currently, stainless steel cookware is widely popular due to its good durability and relatively low cost. However, ordinary stainless steel cookware tends to discolor due to heat during use and a concave-convex structure on its surface is easy to trap dirt, making cleaning quite inconvenient. In order to achieve non-stick performance of ordinary stainless steel cookware and effectively solve a problem of discoloration caused by heating, a layer of polytetrafluoroethylene is usually coated on the surface of cooking utensils. The polytetrafluoroethylene coating is non-toxic under normal conditions, but it will start to volatilize when a heating temperature of the coating reaches 260° C., and start to decompose at temperature reaching 350° C. Therefore, an use temperature of stainless steel cookware with the polytetrafluoroethylene coating generally cannot exceed 250° C. However, common cooking utensils, like frying pans, is often subjected to a heating temperature exceeding 260° C., thus posing safety risks. Additionally, polytetrafluoroethylene coatings are not abrasion-resistant, easy to peel off and be inadvertently taken in along with food, harming physical health. In order to solve the above problems, Physical Vapor Deposition (PVD) technology, which forms a PVD layer on metal surfaces, is gradually applied to stainless steel cookware. To ensure that the stainless steel cookware possesses non-stick performance, the PVD layer must have a concave-convex structure. However, existing PVD layers tends to discolor under high temperatures and existing PVD layers with the concave-convex structure tends to trap dirt, leading to quite inconvenient cleaning.

SUMMARY

In order to solve problems in related technology where PVD layers tends to discolor and trap dirt, the present application provides a PVD target and a use thereof.

In a first aspect, the present application provides a PVD target adopting the following technical solution.

APVD target, the PVD target consists of the following components by mass percentage: silicon 10-30% and a balance metal, wherein the metal includes one or more selected from a group consisting of chromium, zirconium, and titanium.

By adopting the above technical solution, the PVD target provided in the present application can form a composite film composed of metal, silicon, metal nitrides, silicon nitride, and metal silicides on a surface of a metal substrate after undergoing physical vapor deposition. The composite film can ensure a tight bonding of the composite film through a combination of substances with different particle sizes, isolate air, and avoid gaps present in PVD films formed from single-element targets. Therefore, the PVD layer formed by the PVD target provided in the present application can enhance a surface hardness of the metal substrate, ensure that the PVD layer does not discolor when heated, and has good non-stick performance, making the surface easy to clean.

Preferably, the PVD target consists of the following components by mass percentage: silicon 15-20% and a balance chromium.

The present application utilizes silicon and chromium to form the PVD target, which can ensure that a cost of the PVD target is low, while also ensuring that the PVD layer formed by the PVD target has good non-stick performance, and can avoid discoloration of the PVD layer when heated.

In some embodiments, the PVD target consists of the following components by mass percentage: silicon 15-20% and the balance metal, wherein, the metal is chromium and titanium.

The present application utilizes silicon, chromium, and titanium to form the PVD target, which can ensure that the PVD layer formed by the PVD target has a higher hardness.

In some embodiments, a content of titanium is 0.001-3 wt % based on a total weight of the metal.

By limiting the content of titanium, the present application can control the cost of the PVD target while ensuring that the PVD layer formed by the PVD target has a higher hardness, avoiding a decrease in hardness caused by too low a titanium content and also avoiding a problem of cost and hardness improvement not being proportional to an increase in the titanium content.

In some embodiments, the PVD target consists of the following components by mass percentage: silicon 15-20% and the balance metal, wherein, the metal is chromium, zirconium and titanium.

The present application utilizes silicon, chromium, zirconium and titanium to form the PVD target, which can ensure that the PVD layer formed by the PVD target not only has a higher hardness but also retains a natural color of stainless steel.

In some embodiments, a content of titanium is 0.001-3 wt % based on a total weight of the metal.

By limiting the content of titanium, the present application can control the cost of the PVD target while ensuring that the PVD layer formed by the PVD target has a higher hardness, avoiding a decrease in hardness caused by too low a titanium content and also avoiding a problem of cost and hardness improvement not being proportional to an increase in the titanium content.

In a second aspect, the present application provides a use of the PVD target in cookware. In the present invention, the cookware is a cooking utensil, preferably including a frying pan, a soup pot, an inner pot of an electric rice cooker, an inner pot of an electric pressure cooker, an electric hot pot, a baking tray, and the like, which can be heated.

In some embodiments, a PVD coating is provided on an internal metal layer of the cookware by depositing the PVD target on the internal metal layer of the cookware using a PVD process.

Through the above method, the present application can ensure that the cookware has a higher hardness and non-stick performance, and also ensure that the cookware is easy to clean and less likely to discolor when heated.

In some embodiments, a thickness of the PVD coating is 0.8-3 μm.

By limiting the thickness of the PVD coating, the present application can ensure that the PVD coating does not fall off during use.

In some embodiments, a surface roughness (Ra) of the internal metal layer is ≥0.15.

By limiting the surface roughness of the internal metal layer, the present application can ensure that the PVD target is stably deposited on the surface of the internal metal layer during the physical vapor deposition process, without the need for a concave-convex structure.

In summary, the present application includes the following beneficial technical effects.

1. The PVD target provided in the present application consists of silicon 10-30% and the balance metal, the metal includes one or more selected from a group consisting of chromium, zirconium, or titanium. Using the PVD target provided in the present application for physical vapor deposition can form the composite film composed of metal, silicon, metal nitrides, silicon nitride, and metal silicides on the surface of the metal substrate after undergoing physical vapor deposition. The composite film can ensure the tight bonding of the composite film through the combination of substances with different particle sizes, isolate air, and avoid gaps present in PVD films formed from single-element targets. Therefore, the PVD layer formed by the PVD target provided in the present application can enhance the surface hardness of the metal substrate, ensure that the PVD layer does not discolor when heated, and has good non-stick performance, making the surface easy to clean.

The PVD target provided in the present application does not need to limit the surface of the metal substrate to a concave-convex structure during the physical vapor deposition process. Preferably, the surface roughness (Ra) of the metal layer of ≥0.15 is sufficient to ensure that the PVD target provided in the present application can be applied to ordinary metal surfaces, facilitating widespread use.

DETAILED DESCRIPTION

Figure 1:
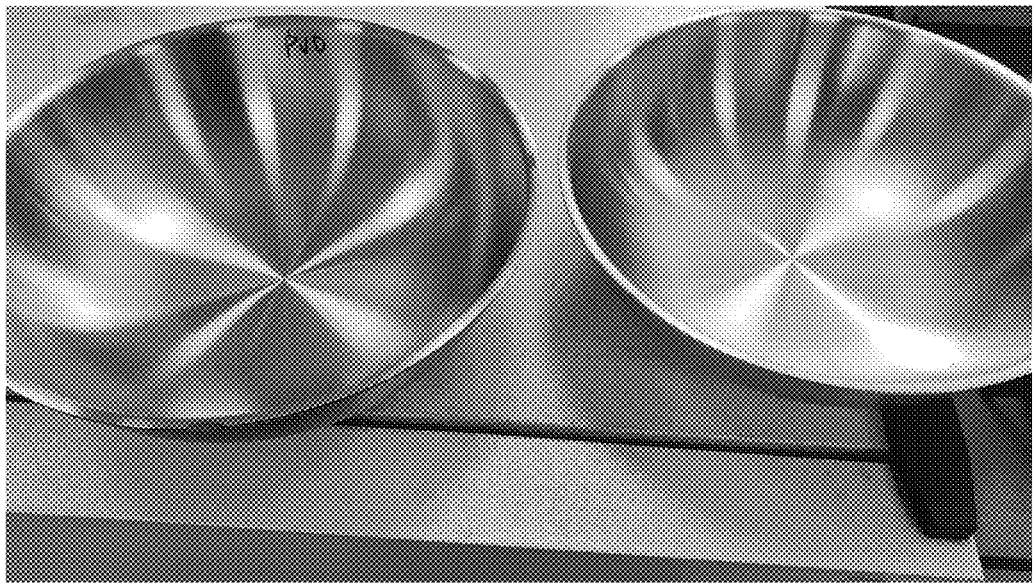
FIG. 1 is a photograph of alloy bowls with a PVD coating in Example 1 and Comparative Example 2 of the present application, after being placed in an environment of 250° C. and left to stand for half an hour.
Figure 2:
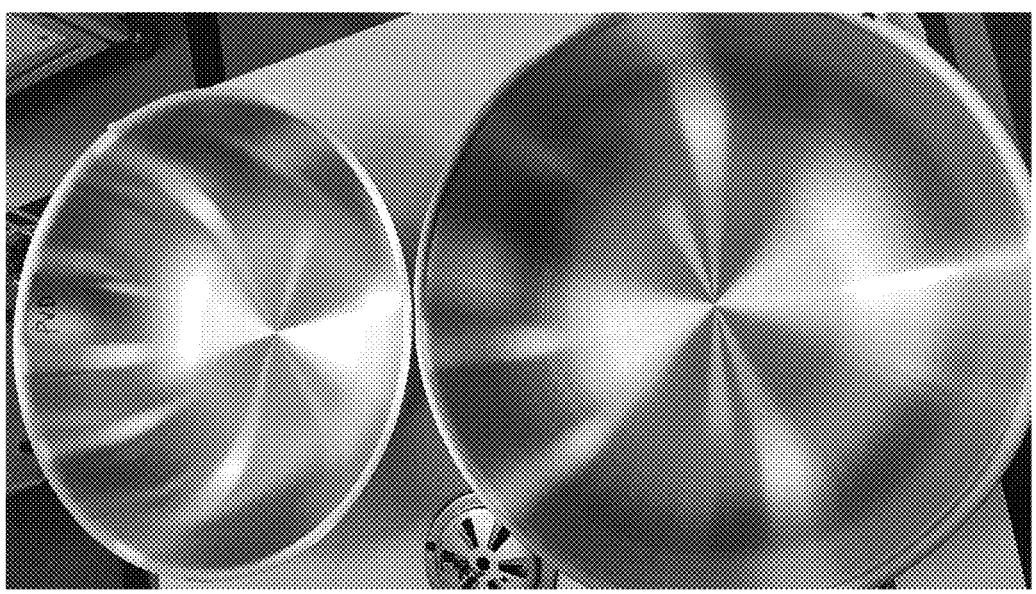
FIG. 2 is a photograph of the alloy bowls with the PVD coating in Example 1 and Comparative Example 2 of the present application, after being placed in an environment of 300° C. and left to stand for half an hour.
Figure 3:
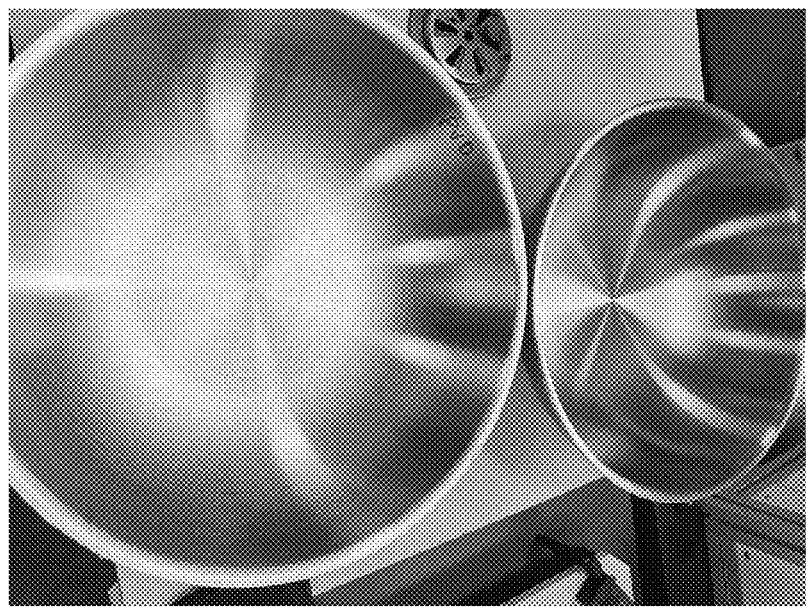
FIG. 3 is a photograph of the alloy bowls with the PVD coating in Example 1 and Comparative Example 2 of the present application, after being placed in an environment of 350° C. and left to stand for half an hour.
Figure 4:
FIG. 4 is a photograph of the alloy bowls with the PVD coating in Example 1 and Comparative Example 2 of the present application, after being placed in an environment of 400° C. and left to stand for half an hour.

The present application will be further described in detail below with reference to the drawings and Examples.

Example 1

A use of a PVD target in cookware was provided, including the following steps.

Step 1: An alloy bowl with a surface roughness (Ra) of 0.5 and a PVD target were installed in a deposition chamber, maintaining a distance of 50 cm between them; the deposition chamber was vacuumed to 4.5×10-3 Pa, then gradually heated from 25° C. to 355° C. within 30 minutes; subsequently, vacuumed to 2.5×10-3 Pa and subjected to a glow discharge plasma surface cleaning treatment for 25 minutes at −800V bias voltage in Ar; wherein, the PVD target by mass percentage consists of 15% silicon and a balance chromium.

Step 2: A etching process was carried out for 10 min at 2.5×10-3 Pa Ar pressure and −600V pulse bias voltage (80% duty cycle and 80 KHz frequency).

Step 3: A PVD coating was prepared by reaction in a pure N2 atmosphere: during a deposition process, N2 was first introduced, and a pressure inside the deposition chamber was adjusted to 3.0×10-3 Pa, and a magnetron sputtering power was turned on to deposit an alloy bowl with a PVD coating with a thickness of 1.51 μm.

Example 2

The difference between Example 2 and Example 1 is that, "the PVD target by mass percentage consists of 15% silicon and a balance chromium" in Example 1 is replaced with "the PVD target1 by mass percentage consists of 20% silicon and a balance chromium".

Example 3

The difference between Example 3 and Example 1 is that, "the PVD target by mass percentage consists of 15% silicon and a balance chromium" in Example 1 is replaced with "the PVD target by mass percentage consists of 15% silicon, 82% chromium, and 3% titanium".

Example 4

The difference between Example 4 and Example 1 is that, "the PVD target by mass percentage consists of 15% silicon and a balance chromium" in Example 1 is replaced with "the PVD target by mass percentage consists of 15% silicon, 84.9% chromium, and 0.1% titanium".

Example 5

The difference between Example 5 and Example 1 is that, "the PVD target by mass percentage consists of 15% silicon and a balance chromium" in Example 1 is replaced with "the PVD target by mass percentage consists of 15% silicon, 41% chromium, 41% zirconium, and 3% titanium".

Comparative Example 1

The difference between Comparative Example 1 and Example 1 is that, "the PVD target by mass percentage consists of 15-20% silicon and a balance chromium" in Example 1 is replaced with "the PVD target by mass percentage consists of 15% silicon, 80% chromium, and 5% titanium".

Comparative Example 2

The difference between Comparative Example 2 and Example 1 is that, "the PVD target by mass percentage consists of 15% silicon and a balance chromium" in Example 1 is replaced with "the PVD target is a commercially available PVD target".

Performance Testing

A high temperature treatment was performed on the alloy bowls with the PVD coating in Examples 1-5 and Comparative Examples 1-2, respectively. The alloy bowls with the PVD coating in Examples 1-5 and Comparative Examples 1-2 were placed in environments of 250° C., 300° C., 350° C., and 400° C., and left to stand for half an hour for observing discoloration. Results were shown in Table 1. Additionally, FIG. 1-4 are photographs of the alloy bowls with the PVD coating in Example 1 and Comparative Example 2, placed in environments of 250° C., 300° C., 350° C., and 400° C., and left to stand for half an hour, respectively; wherein, the alloy bowls marked with PVD were from Example 1.

Discoloration of Examples 1-5 and Comparative Examples 1-2

| Items | Example 1 | Example 2 | Example 3 | Example 4 | Example 5 | Comparative Example 1 | Comparative Example 2 |
|---|---|---|---|---|---|---|---|
| 250° C. | No discoloration | No discoloration | No discoloration | No discoloration | No discoloration | No discoloration | Discoloration, with a grayish black color |
| 300° C. | No discoloration | No discoloration | No discoloration | No discoloration | No discoloration | No discoloration | Discoloration, with a grayish black color |
| 350° C. | No discoloration | No discoloration | No discoloration | No discoloration | No discoloration | No discoloration | Discoloration, with a grayish black color |
| 400° C. | No discoloration | No discoloration | No discoloration | No discoloration | No discoloration | No discoloration | Discoloration, with a grayish black color |

Figure 5:
FIG. 5 is a photograph of the alloy bowl with the PVD coating in Example 1 of the present application, after being soaked in oil and cleaned.
Figure 6:
FIG. 6 is a photograph of the alloy bowl with the PVD coating in Comparative Example 2 of the present application, after being soaked in oil and cleaned.

The alloy bowls with the PVD coating in Examples 1-5 and Comparative Examples 1-2 were soaked in oil and cleaned. Cleaning results were shown in Table 2. Additionally, FIG. 5 is a photograph of the alloy bowl with the PVD coating in Example 1 of the present application, after being soaked in oil and cleaned, and FIG. 6 is a photograph of the alloy bowl with the PVD coating in Comparative Example 2 of the present application, after being soaked in oil and cleaned.

TABLE 2

Cleaning Results of Examples 1-5 and Comparative Examples 1-2

| Items | Example 1 | Example 2 | Example 3 | Example 4 | Example 5 | Comparative Example 1 | Comparative Example 2 |
|---|---|---|---|---|---|---|---|
| Surface condition after cleaning oil | No oil | No oil | No oil | No oil | No oil | No oil | No oil |

A hardness test was conducted on the alloy bowls with the PVD coating in Examples 1-5 and Comparative Examples 1-2 according to GB/T4342-1991 "Metallic Micro Vickers Hardness Test Method". Hardness results were shown in Table 3.

TABLE 3

Hardness Test Results of Examples 1-5 and Comparative Examples 1-2

| Items | Example 1 | Example 2 | Example 3 | Example 4 | Example 5 | Comparative Example 1 | Comparative Example 2 |
|---|---|---|---|---|---|---|---|
| Hardness/HV | 1550 | 1570 | 1630 | 1640 | 1680 | 1440 | 1150 |

A non-stick performance test was conducted on the alloy bowls with the PVD coating in Examples 1-5 and Comparative Examples 1-2. A testing method included the following steps: a) a suitable amount of vegetable oil was poured into the alloy bowl, and the non-stick surface was wiped with a soft cloth until the vegetable oil was evenly coated; b) cleaned with warm water above 60° C. and a neutral detergent, then rinsed with clean water and dried; c) the cooking utensil was placed on an electric stove rated at 220V and an output power of 1 kW, then heated, and a surface temperature was measured using a surface thermometer with an accuracy not less than 2.5. When the surface temperature of the PVD coating reached 150° C.-170° C., broken a fresh egg, complying with SB/T 10277-1997 grade 2 standards (weight between 50 g-60 g), and placed it into the cooking utensil until egg white was basically solidified (the surface temperature of the PVD coating should not exceed 210° C. throughout the cooking process); d) a plastic spatula with a sharp edge thickness of 0.2 mm-0.5 mm was used to completely remove the egg. If any egg residue remained, gently wiped it off with a damp sponge or gauze; repeated steps c) and d) three times, and observed. Results were shown in Table 4.

TABLE 4

Non-Stick Performance Test Results of Examples 1-5 and Comparative Examples 1-2

| Items | Example 1 | Example 2 | Example 3 | Example 4 | Example 5 | Comparative Example 1 | Comparative Example 2 |
|---|---|---|---|---|---|---|---|
| Non-stick effect | Level I | Level I | Level I | Level I | Level I | Level I | Level II |

From Examples 1-5 and Comparative Examples 1-2, as well as Tables 1-4 and FIG. 1-6, it can be seen that the use of the PVD target provided in the present application in cookware can enhance the surface hardness of the metal substrate. The hardness of the PVD coating provided in the present application is more than eight times that of ordinary steel materials. Moreover, the PVD target provided in the present application can ensure that the PVD layer does not discolor when heated, has good non-stick performance, and the surface is easy to clean with no obvious oil residue after cleaning. Additionally, by limiting the content of titanium, the present application can avoid the problem of cost and hardness improvement not being proportional to the increase in titanium content.

Example 6

The difference between Example 6 and Example 1 is that, "a thickness of 1.51 μm" in Example 1 is replaced with "a thickness of 2.4 μm".

Comparative Example 3

The difference between Comparative Example 3 and Comparative Example 2 is that, "a surface roughness (Ra) of 0.5" in Comparative Example 2 is replaced with "a surface roughness (Ra) of 0.16".

The hardness test was conducted on the alloy bowls with the PVD coating in Example 6 and Comparative Example 3 according to GB/T4342-1991 "Metallic Micro Vickers Hardness Test Method". The hardness test results were shown in Table 5.

TABLE 5

Hardness Test Results of Examples 1 and 6, and Comparative Example 3

| Items | Example 1 | Example 6 | Comparative Example 3 |
|---|---|---|---|
| Hardness/HV | 1550 | 1555 | 1540 |

The non-stick performance test was conducted on the alloy bowls with the PVD coating in Examples 1 and 6, and Comparative Example 3. The testing method included the following steps: a) a suitable amount of vegetable oil was poured into the alloy bowl, and the non-stick surface was wiped with a soft cloth until the vegetable oil was evenly coated; b) cleaned with warm water above 60° C. and a neutral detergent, then rinsed with clean water and dried; c) the cooking utensil was placed on an electric stove rated at 220V and an output power of 1 kW, then was heated, and a surface temperature was measured using a surface thermometer with an accuracy not less than 2.5. When the surface temperature of the PVD coating reached 150° C.-170° C., broken a fresh egg, complying with SB/T 10277-1997 grade 2 standards (weight between 50 g-60 g), and placed it into the cooking utensil until the egg white was basically solidified (the surface temperature of the PVD coating should not exceed 210° C. throughout the cooking process); d) a plastic spatula with a sharp edge thickness of 0.2 mm-0.5 mm was used to completely remove the egg. If any egg residue remained, gently wiped it off with a damp sponge or gauze; repeated steps c) and d) three times, and observed. Results were shown in Table 6.

TABLE 6

Non-Stick Performance Test Results for Examples 1 and 6, and Comparative Example 3

| Items | Example 1 | Example 6 | Comparative Example 3 |
|---|---|---|---|
| Non-stick effect | Level I | Level I | Level II |

From Examples 1 and 6, and Comparative Example 3, as well as Tables 5 and 6, it can be seen that the PVD coating formed by physical vapor deposition using the PVD target provided in the present application has good hardness and non-stick performance on metal surfaces with different surface roughnesses. Additionally, the thickness of the deposited PVD film does not affect its hardness and non-stick performance. However, the commercially available PVD target cannot form a PVD coating with non-stick performance on the metal surface. This is because existing PVD targets rely on an original concave-convex structure of the substrate to ensure overall non-stick performance. When the surface of the substrate does not have a concave-convex structure, the PVD films formed by the existing PVD targets cannot provide the overall non-stick performance. However, the PVD target provided in the present application does not need a concave-convex structure on the surface of the substrate and can form a dense PVD coating on a smooth metal surface to ensure non-stick performance.

The embodiment is merely an explanation of the present application and is not a limitation of the present application. Those skilled in the art can make non-creative modifications to the embodiment as needed after reading this specification, but as long as they are within the scope of the claims of the present application, they are protected by patent law.

What is claimed is:

1. Use of a physical vapor deposition (PVD) target in cookware, wherein a PVD coating is provided on an internal metal layer of the cookware by depositing the PVD target on the internal metal layer of the cookware using a PVD process, the PVD target consists of the following components by mass percentage: silicon 10-30% and a balance metal, wherein the metal comprises one or more selected from a group consisting of chromium, zirconium, and titanium, and a thickness of the PVD coating is 0.8-3 μm.

2. The use according to claim 1, wherein the PVD target consists of the following components by mass percentage: silicon 15-20% and the balance is the chromium.

3. The use according to claim 1, wherein the PVD target consists of the following components by mass percentage: silicon 15-20% and the balance is the metal, wherein the metal is the chromium and the titanium.

4. The use according to claim 3, wherein a content of the titanium is 0.001-3 wt % based on a total weight of the metal.

5. The use according to claim 1, wherein the PVD target consists of the following components by mass percentage: silicon 15-20% and the balance is the metal, wherein the metal is the chromium, the zirconium and the titanium.

6. The use according to claim 5, wherein a content of the titanium is 0.001-3 wt % based on a total weight of the metal.

7. The use according to claim 1, wherein a surface roughness (Ra) of the internal metal layer is ≥0.15 μm.

* * * * *